United States Patent
Then et al.

(10) Patent No.: US 11,158,712 B2
(45) Date of Patent: Oct. 26, 2021

(54) FIELD-EFFECT TRANSISTORS WITH BURIED GATES AND METHODS OF MANUFACTURING THE SAME

(71) Applicant: Intel Corporation, Santa Clara, CA (US)

(72) Inventors: Han Wui Then, Portland, OR (US); Paul Fischer, Portland, OR (US); Marko Radosavljevic, Portland, OR (US); Sansaptak Dasgupta, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/649,505

(22) PCT Filed: Dec. 27, 2017

(86) PCT No.: PCT/US2017/068564
§ 371 (c)(1),
(2) Date: Mar. 20, 2020

(87) PCT Pub. No.: WO2019/132892
PCT Pub. Date: Jul. 4, 2019

(65) Prior Publication Data
US 2020/0312970 A1    Oct. 1, 2020

(51) Int. Cl.
*H01L 29/423*     (2006.01)
*H01L 21/8234*    (2006.01)
*H01L 23/498*     (2006.01)
*H01L 27/092*     (2006.01)

(52) U.S. Cl.
CPC ........ *H01L 29/42356* (2013.01); *H01L 21/823456* (2013.01); *H01L 23/49827* (2013.01); *H01L 27/0922* (2013.01)

(58) Field of Classification Search
CPC .......... H01L 29/7831; H01L 29/66484; H01L 29/4958; H01L 29/42356; H01L 29/42372; H01L 29/42376; H01L 29/7786; H01L 2924/13081; H01L 2924/13085; H01L 2924/13092; H01L 21/823456;
(Continued)

(56) References Cited

U.S. PATENT DOCUMENTS

| | | |
|---|---|---|
| 2002/0185684 A1 | 12/2002 | Campbell et al. |
| 2011/0134698 A1 | 6/2011 | Mazure et al. |
| 2011/0187412 A1 | 8/2011 | Ma et al. |

(Continued)

OTHER PUBLICATIONS

International Search Report & Written Opinion dated Sep. 21, 2018 for PCT Patent Application No. PCT/US217/068564.

*Primary Examiner* — Joseph C. Nicely
(74) *Attorney, Agent, or Firm* — Green, Howard & Mughal LLP

(57) ABSTRACT

Field-effect transistors with buried gates and methods of manufacturing the same are disclosed. An example apparatus includes a source, a drain, and a semiconductor material positioned between the source and the drain. The example apparatus further includes a first gate positioned adjacent the semiconductor material. The example apparatus also includes a second gate positioned adjacent the semiconductor material. A portion of the semiconductor material is positioned between the first and second gates.

20 Claims, 13 Drawing Sheets

(58) Field of Classification Search
CPC ....... H01L 21/82345; H01L 21/823842; H01L 21/82385; H01L 27/0922
See application file for complete search history.

(56) References Cited

U.S. PATENT DOCUMENTS

| | | | |
|---|---|---|---|
| 2012/0313182 A1* | 12/2012 | Huguenin | H01L 21/823842 257/369 |
| 2013/0093002 A1 | 4/2013 | Zhu et al. | |
| 2015/0091091 A1* | 4/2015 | Liu | H01L 29/16 257/365 |
| 2016/0276438 A1* | 9/2016 | Chu-Kung | H01L 29/2003 |

* cited by examiner

US 11,158,712 B2

FIELD-EFFECT TRANSISTORS WITH BURIED GATES AND METHODS OF MANUFACTURING THE SAME

CLAIM OF PRIORITY

This Application is a National Stage Entry of, and claims priority to, PCT Patent Application No. PCT/US17/68564, filed on Dec. 27, 2017, and titled "FIELD-EFFECT TRANSISTORS WITH BURIED GATES AND METHODS OF MANUFACTURING THE SAME", which is incorporated by reference in its entirety for all purposes.

FIELD OF THE DISCLOSURE

This disclosure relates generally to semiconductor devices, and, more particularly, to field-effect transistors with buried gates and methods of manufacturing the same.

BACKGROUND

Field-effect transistors (FETs) include a gate to control the conductivity of a semiconductor material extending between a source and drain of the transistor. More particularly, when energized, the gate activates a channel to enable current to pass between the source and the drain. The channel (and, thus, the flow of current) is typically located near the surface of the semiconductor material close to the gate. However, it is possible for electrical paths to develop between the source and drain within the main body of the semiconductor material below the channel. Current within the bulk or main body of the semiconductor material below the channel is sometimes referred to as "punch through current," or simply, "punch through."

Punch through is problematic to the performance of transistors because it cannot be controlled or modulated by the electric field produced by the gate. The likelihood of punch through occurring increases as the scale of the transistor decreases and/or as the voltage applied to the transistor increases. Accordingly, the punch through effect poses challenges to reducing the scale of transistors and using transistors in high voltage applications.

Figure 1:
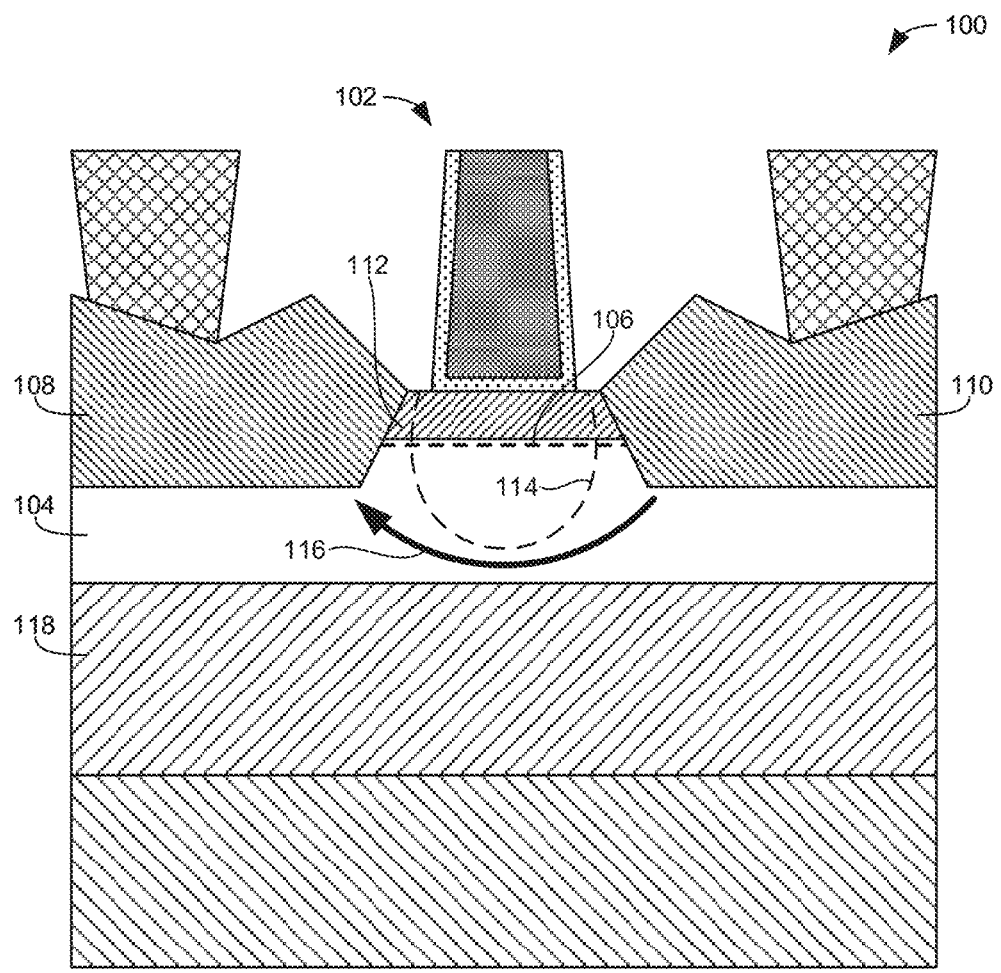
FIG. 1 is a cross-sectional view of a known transistor.

The figures are not to scale. Instead, for clarity, the thickness of layers and/or regions may be enlarged in the drawings. Moreover, the illustrated layers and/or regions are idealized; it being understood that manufacturing in the real world may result in blending and/or irregularities between layer(s) and/or region(s). Wherever beneficial, the same reference numbers will be used throughout the drawing(s) and accompanying written description to refer to the same or like parts. As used in this patent, stating that any part (e.g., a layer, film, area, or plate) is in any way on positioned on, located on, disposed on, or formed on, etc.) another part, indicates that the referenced part is either in contact with the other part, or that the referenced part is above the other part one or more intermediate part(s) located therebetween. Stating that any part is in contact with another part means that there is no intermediate part between the two parts.

DETAILED DESCRIPTION

FIG. 1 is a cross-sectional view of a planar transistor 100 manufactured using known techniques. In FIG. 1, a gate 102 may be switched on and off based on the application of an electric potential. When energized, the gate 102 produces an electric field that extends into the semiconductor material 104 to control the conductivity of the semiconductor material 104. When the electric field is applied to the semiconductor material 104, a channel (represented by the broken line 106) is activated between source and drain regions 108, 110 to allow the flow of current therebetween. The channel typically forms in a region having a thickness of less than about 4 nanometers within the semiconductor material 104 in the surface of the semiconductor material 104 adjacent a polarization layer 112. The channel within this thin region is sometimes referred to as a two-dimensional (2D) electron gas.

While the flow of current within the channel 106 at the interface between the polarization layer 112 and the semiconductor material 104 may be controlled by controlling the electric field produced by the gate 102, there may be situations where current will flow through the main body of the semiconductor material 104 outside of the channel. In particular, the ability of the electric field to control the conductivity of the semiconductor material 104 is dependent on the reach of the electric field into the semiconductor material. There is a limit to the reach of the electric field for which control is effective. For purposes of explanation, this limit is referred to herein as the "effective control reach" of the electric field produced by the gate 102 and is represented in FIG. 1 by the dashed line 114.

As shown in FIG. 1, the effective control reach 114 associated with the gate 102 does not reach through the full thickness of the semiconductor material 104. As such, there is a region of the semiconductor material 104 for which the gate 102 cannot effectively control the conductivity of the material. In such situations, there is the possibility of a punch through current (represented by the arrow 116) appearing within the semiconductor material 104 that goes underneath and around the effective control reach 114 of the electric field produced by the gate.

One known solution to reducing the likelihood of punch through current is to reduce the thickness of the semiconductor material 104. If the semiconductor material 104 is sufficiently thin, the effective control reach 114 associated with the gate 102 may extend into a buffer layer 118 beneath the semiconductor material 104 (adjacent on opposite surface of the semiconductor material 104 to where the channel 106 is located). The buffer layer 118 may be formed of a material that has a higher bandgap than the semiconductor material 104 to effectively act as an insulator or barrier that blocks electrical paths from forming for current to flow therethrough A problem with the known approach of reducing the thickness of the semiconductor material 104 is that this thickness reduction can adversely impact the mobility of electrons in the semiconductor material 104 and, thus, adversely impact the performance of the transistor 100. Accordingly, rather than reducing the thickness of the semiconductor material, examples disclosed herein reduce the likelihood of punch through current by extending the effective control reach of the electric field produced by the gate. In some examples disclosed herein, the effective control reach is extended by embedding or burying a second gate within the body of the semiconductor material beneath a first gate on top of the semiconductor material. In disclosed examples, the first and second gates are positioned in vertical alignment. For purposes of explanation, the first gate on top of the semiconductor material is referred to herein as the "top gate," whereas the second gate within the body of the semiconductor material is referred to herein as the "buried gate." Examples disclosed herein achieve a reduction in punch through without reducing the thickness of the layer of semiconductor material and/or reduce punch through even with a thicker layer of semiconductor material than what is used in known transistors. In particular, in examples where the semiconductor material is gallium nitride, the semiconductor layer in known transistors is typically less than or equal to 20 nanometers but no thinner than 10 nanometers. In some disclosed examples, the thickness of the semiconductor layer is greater than 20 nanometers (e.g., 25 nm, 30 nm, 50 nm, 100 nm) while still reducing (e.g., preventing) punch through current below the channel.

Figure 2:
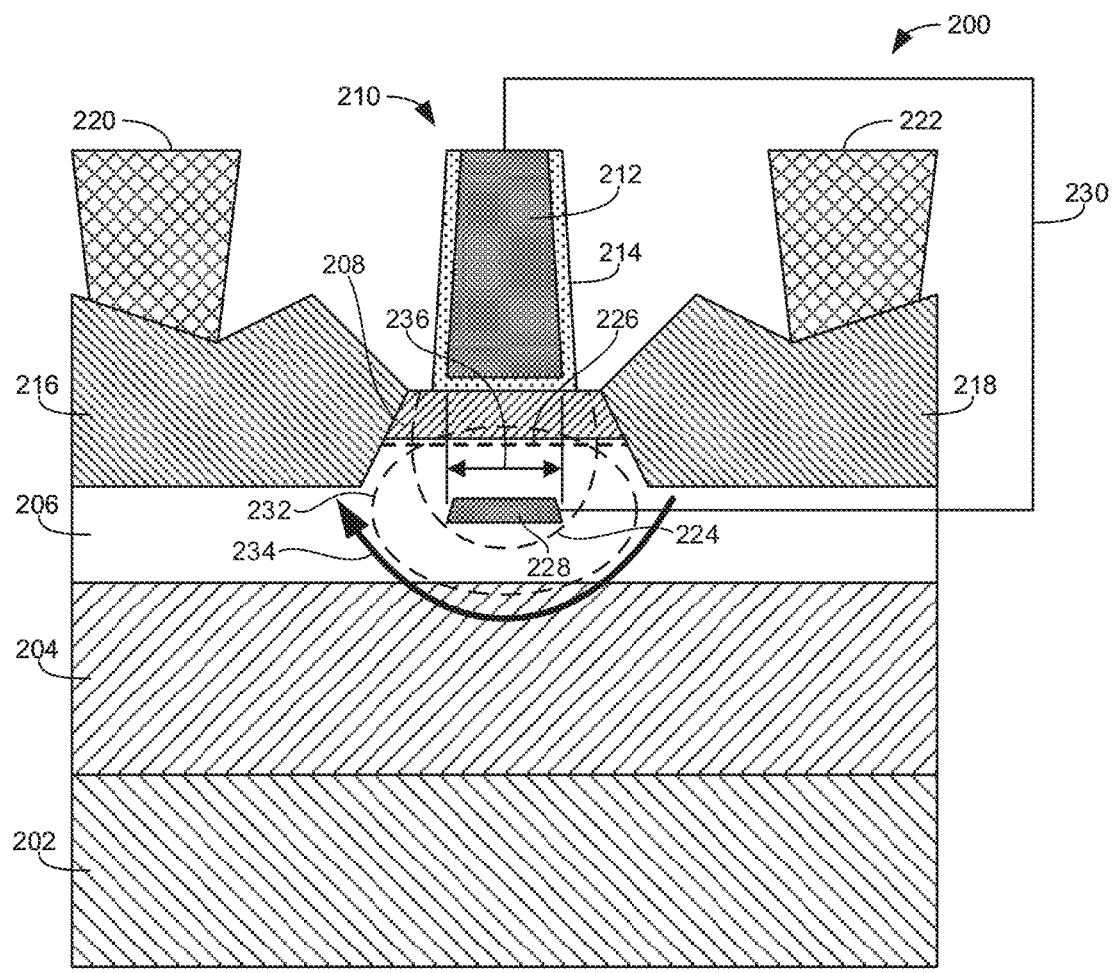
FIG. 2 is a cross-sectional view of an example transistor constructed in accordance with teachings disclosed herein.

FIG. 2 is a cross-sectional view of an example transistor 200 constructed in accordance with teachings of this disclosure. In the illustrated example of FIG. 2, the transistor 200 is formed on a base semiconductor substrate or wafer 202. The base substrate 202 may be formed of any suitable semiconductor material, such as, for example, silicon (Si) with the crystalline structure arranged in any suitable orientation (e.g., Si 111, Si 110, Si 100). Additionally or alternatively, the base substrate 202 may be formed of other suitable semiconductor materials (e.g., germanium (Ge), gallium arsenide (GaAs), etc.). For purposes of explanation, the base substrate 202 will be assumed to be Si 111.

In the illustrated example of FIG. 2, a buffer layer 204 is formed on the base substrate 202 to serve as a transition between the different crystalline structures of the base substrate 202 and an upper semiconductor material 206. The buffer layer 204 may include a composition of aluminum (Al), gallium (Ga), and nitrogen (N). More particularly, in some examples, aluminum nitride (AlN) is deposited on the base substrate 202 with aluminum gallium nitride (AlGaN) deposited thereafter. In the illustrated example, the upper semiconductor material 206 is gallium nitride (GaN). Gallium nitride is beneficial for transistors used in high voltage applications because it has a bandgap that is nearly three times greater than silicon (silicon has a bandgap of approximately 1.1 eV, whereas gallium nitride has a bandgap of approximately 3.4 eV).

A polarization layer 208 is formed on the upper semiconductor material 206 and supports a top gate 210. The polarization layer 208 may include a composition of aluminum (Al), indium (In), gallium (Ga), and nitrogen (N). In the illustrated example, the top gate 210 includes a gate conductor 212 that is surrounded by a gate dielectric 214. The gate conductor 212 may be metal (e.g., aluminum (Al), tungsten (W), etc.) or a non-metal conductor (e.g., polysilicon). The gate dielectric 214 may be formed of silicon dioxide ($SiO_2$) or any suitable high-K dielectric such as, for example, alumina ($Al_2O_3$), hafnia ($HfO_2$), zirconia ($ZrO_2$), silicon nitride ($Si_3N_4$), etc.

On either side of the top gate 210, the transistor 200 of FIG. 2 includes a doped source region 216 and a doped drain region 218. In the illustrated example, the source and drain regions 216, 218 include a crystal structure of indium gallium nitride (InGaN) that has been highly doped with silicon to improve electrical connectivity with metal contacts 220, 222 formed on the respective source and drain regions 216, 218.

In the illustrated example, the top gate 210 produces an electric field when powered that is capable of controlling the conductivity of the semiconductor material 206 within an effective control reach 224 of the electric field. As shown in FIG. 2, the effective control reach 224 extends over a channel 226 (e.g., at the interface between the semiconductor material 206 and the polarization layer 208) of the transistor 200 to effectively control current flow therethrough.

In contrast with the known transistor 100 of FIG. 1, the example transistor 200 of FIG. 2 includes a buried gate 228 within the main body of the semiconductor material 206 spaced apart from and in vertical alignment with the top gate 210. As such, a portion of the semiconductor material 206 is between the buried gate 228 and the top gate 210 above the semiconductor material 206. In other words, the buried gate 228 is positioned on one side of the channel 226 while the top gate 210 is positioned on the opposite side of the channel 226. Further, as shown in the illustrated example, a second portion of the semiconductor material 206 is below the buried gate 228 (e.g., the second portion is farther away from the top gate 210 than the buried gate 228). In other examples, the buried gate 228 may be in contact with the buffer layer 204 such that no portion of the semiconductor material 206 is below the buried gate 228. In other words, the buried gate 228 may be positioned at the bottom of the semiconductor material 206.

In some examples, the buried gate 228 is made of the same material as the top gate 210. For example, the buried gate may be formed of a refractory metal (e.g., tungsten (W), titanium nitride (TiN), thallium nitride ($Tl_3N$), etc.) or a non-metal conductor (e.g., resistive polysilicon). In other examples, the material of the buried gate 228 may be different than the material of the top gate 210. In the illustrated example, the buried gate 228 is electrically connected to (in circuit with) the top gate 210 (as represented by the line 230) so that both gates are maintained at the same electric potential. In this manner, both gates 210, 228 are switched on and off together to produce a corresponding electric field that modulates or otherwise controls the conductivity of the semiconductor material 206.

The effectiveness or ability of the gates 210, 228 to control the conductivity of the semiconductor material 206 depends upon the distance between either one of the gates 210, 228 and the location of the semiconductor material 206 to be controlled because the electric field produced by the gates 210, 228 weakens as the distance increases. The limit to the reach of such an electric field for which control is effective to satisfy performance specifications is referred to herein as the effective control reach of the electric field. For purposes of explanation, separate effective control reaches for electric fields produced by each of the gates 210, 228 are illustrated in FIG. 2. In particular, the top gate 210 has an effective control reach 224 associated with the electric field it produces. The buried gate 228 has a separate corresponding effective control reach 232 for its electric field. In some examples, the separate electric fields function as a single electric field that controls the region defined by the combination of both effective control reaches 224, 234. Thus, in the illustrated example, the buried gate 228 is a means for extending the effective control reach of the top gate 210. In the illustrated example, the buried gate 228 is positioned within the effective control reach 224 of the electric field produced by the top gate 210 such that there is significant overlap in the effective control reaches 224, 232 associated with the two gates 210, 228. In other examples, the buried gate 228 may be positioned outside of the effective control reach 224 associated with the top gate 210 but close enough so that the effective control reaches 224, 232 of the two gates still overlap. In other words, the distance between the top gate 210 and the buried gate 228 may be any suitable distance less than the combined distance of both effective control reaches 224, 232.

As shown in the illustrated example, the effective control reach 232 of the buried gate 228 extends into the buffer layer 204. That is, the effective control reach is greater than the thickness of the portion of the semiconductor material 206 between the buried gate 228 and the buffer layer 204. As a result, the gates 210, 228, working in combination, are able to control the conductivity of the semiconductor material 206 throughout its entire thickness (between the buffer layer 204 and the polarization layer 208). This is achieved without reducing the thickness of the semiconductor material 206. That is, this may be implemented in a semiconductor material that is more than 20 nm thick. In this manner, the likelihood of punch through current (represented by the arrow 234) is significantly reduced because the punch through current would be forced to travel through the buffer layer 204, which has a much higher bandgap than the semiconductor material 206. In particular, gallium nitride (associated with the semiconductor material 206 in this example) has a bandgap of approximately 3.4 eV, whereas aluminum gallium nitride (associated with the buffer layer 204 in this example) can have a bandgap as high as 6.2 eV (depending on the concentration of the aluminum).

The inclusion of a buried gate may be incorporated into any suitable transistor made of any suitable type(s) of materials. For instance, a buried gate may be positioned within a semiconductor material that is not associated with an underlying buffer layer. In such examples, while extending the effective control reach deeper into the semiconductor material may not extend into a different material as described above, the increased depth of the effective control reach with a buried gate may nevertheless reduce the likelihood of punch through by forcing longer electrical paths to form within the main body of the material between the source and drain regions.

Figure 3:
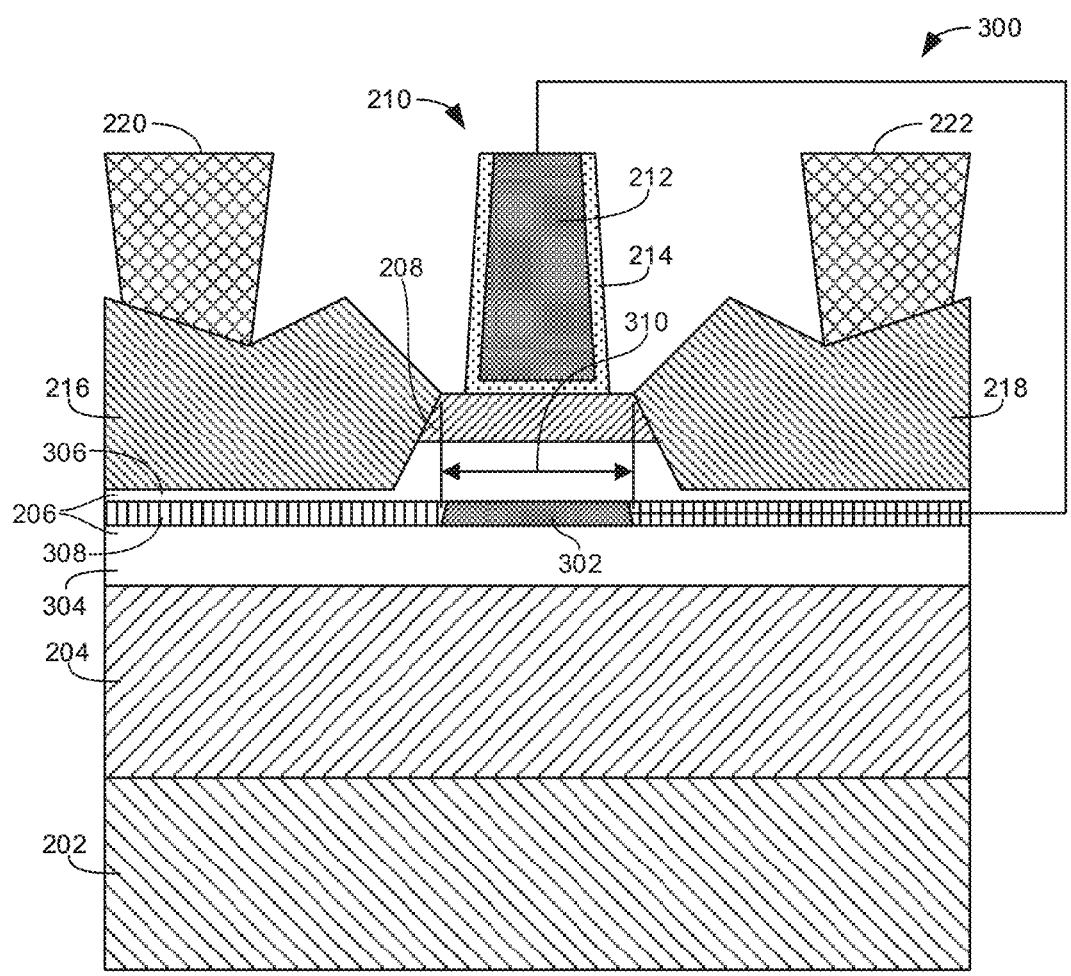
FIG. 3 is a cross-sectional view of another example transistor constructed in accordance with teachings disclosed herein.

FIG. 3 is a cross-sectional view of another example transistor 300 constructed in accordance with teachings of this disclosure. The example transistor 300 is similar to the transistor of FIG. 2. For instance, like transistor 200 of FIG. 2, the example transistor 300 of FIG. 3 includes a base semiconductor substrate 202, buffer layer 204, semiconductor material 206, polarization layer 208, gate 210 (including the gate conductor 212 and gate dielectric 214), and source and drain regions 216, 218 with the associated metal contacts 220, 222. The example transistor 300 of FIG. 3 also includes a buried gate 302 similar to the buried gate 228 of FIG. 2, except that the gate 302 of FIG. 3 is buried using a different manufacturing process than the process used to bury the gate 228 of FIG. 2. In particular, in FIG. 3, the buried gate 302 is positioned between first and second portions 304, 306 of the semiconductor material 206. In the illustrated example, the first and second portions 304, 306 of the semiconductor material 206 are separately formed and attached to one another via a bonding oxide 308 positioned therebetween. By contrast, the semiconductor material 206 shown in FIG. 2 is a unitary or integrated layer of material that is epitaxially grown over the buried gate 228. Further detail regarding different example methods of manufacturing the example transistors 200, 300 of FIGS. 2 and 3 are provided below in connection with FIGS. 4-22. In particular, FIGS. 4-11 correspond to the manufacture of the example transistor 200 of FIG. 2. FIGS. 12-22 correspond to the manufacture of the example transistor 300 of FIG. 3

In addition to the bonding oxide 308, the example transistor 300 of FIG. 3 differs from the example transistor 200 of FIG. 2 in that the buried gates 228, 302 in each example have different dimensions. The buried gates 228, 302 may have any suitable dimensions. In some examples, the buried gates 228, 302 may have any suitable thickness ranging from 5 nanometers up to 100 nanometers (e.g., 5 nm, 20 nm, 50 nm, etc.). By way of comparison, the full thickness of the semiconductor material 206 (e.g., between the buffer layer 204 and the polarization layer 208) may range from 0.5 micrometers to 1 micrometer. In some examples, the buried gates 228, 302 have a length ranging from the length of the top gate 210 (e.g., the length 236 as shown in FIG. 2) up to the distance between the source and drain regions 216, 218 (e.g., the length 310 as shown in FIG. 3). In other examples, the buried gates 228, 302 may have a length even greater than that shown in FIG. 3 or less than that shown in FIG. 2. While the dimensions of the top gate and the buried gate may vary, preferably at least a portion of the top gate is in vertical alignment (e.g., positioned directly above) a portion of the buried gate.

Figure 4:
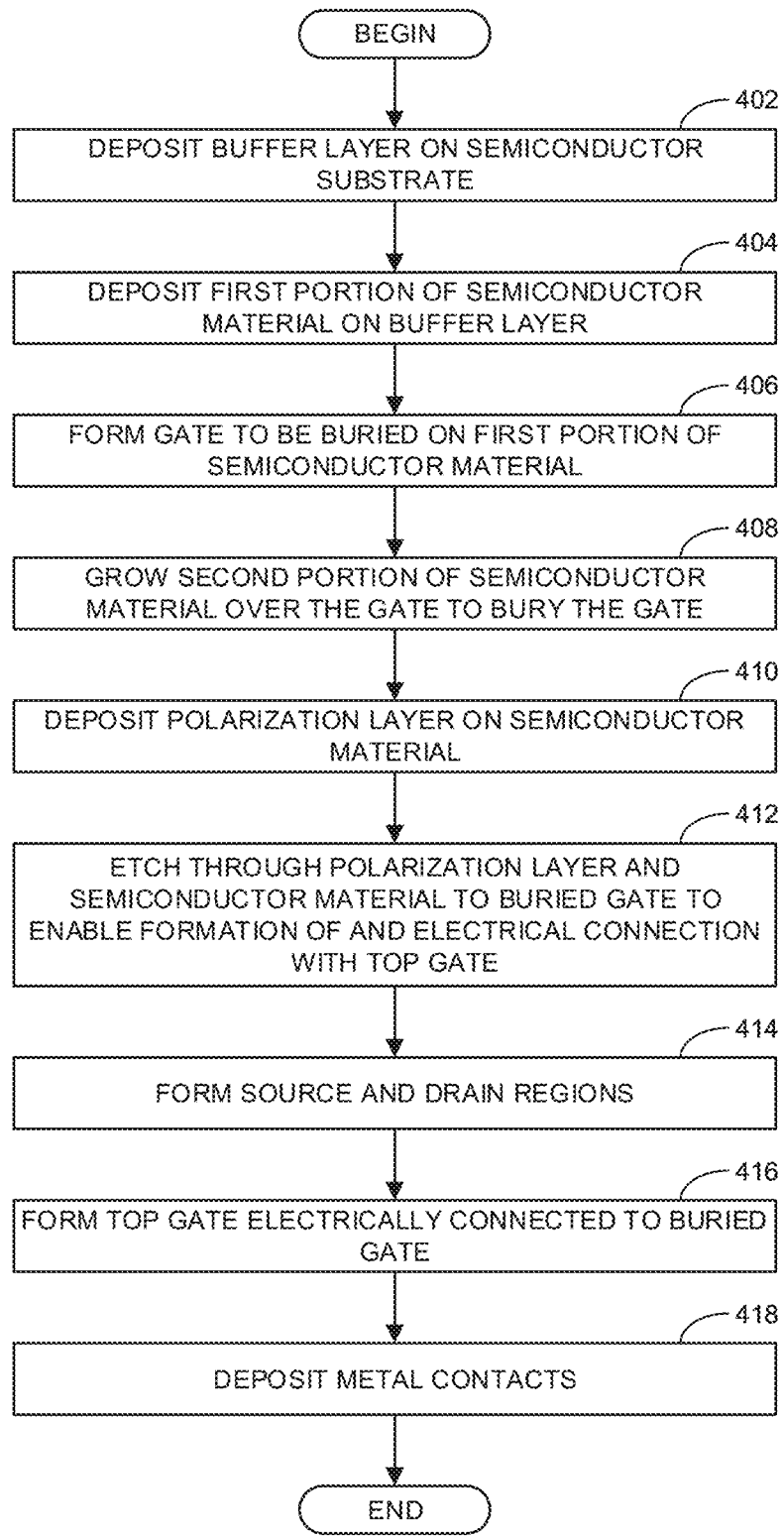
FIG. 4 is a flowchart representative of an example method to manufacture the example transistor of FIG. 2.
Figure 5:
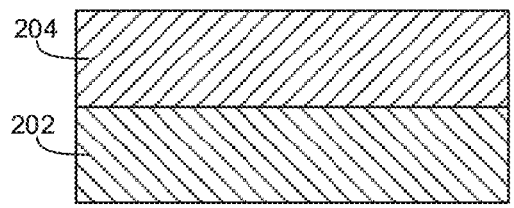
FIGS. 5-11 illustrate stages in the example method of FIG. 4.
Figure 6:
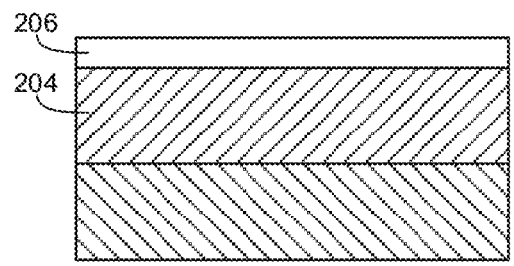
Figure 7:
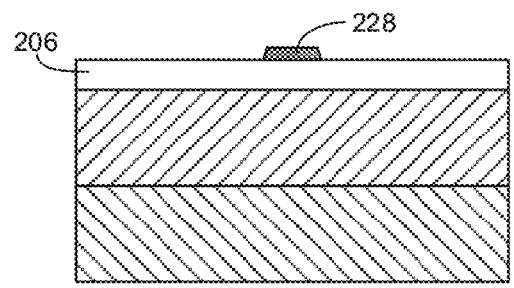

FIG. 4 is a flowchart representative of an example method to manufacture the example transistor 200 of FIG. 2. FIGS. 5-11 illustrate stages in the manufacturing of the transistor 200 of FIG. 2 and will be referenced in the following discussion of FIG. 4. The example process begins at block 402 where the buffer layer 204 is deposited on the base semiconductor substrate 202 (as represented in FIG. 5). At block 404, a first portion of the semiconductor material 206 is deposited on the buffer layer 204 (as represented in FIG. 6). At block 406, the gate 228 to be buried is formed on the first portion of the semiconductor material 206 (as represented in FIG. 7). In some examples, the gate 228 is formed by depositing the material for the gate 228 across the surface of the first portion of the semiconductor material 206. Thereafter, a pattern and etch process are implemented to remove unneeded portions of the material associated with the gate 228 to leave the gate 228 as shown in FIG. 7.

Figure 8:
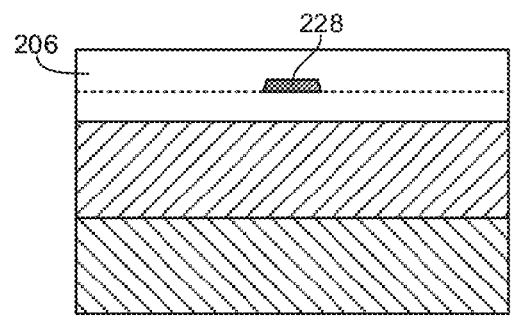

At block 408, a second portion of the semiconductor material 206 is grown over the gate thereby burying the same (as represented in FIG. 8). In the illustrated example of FIG. 8, a dashed line is provided to demarcate where the first portion of the semiconductor material 206 ends and the second portion of the semiconductor material 206 begins. However, the dashed line is provided only for purposes of reference relative to FIG. 7 because the second portion of the semiconductor material 206 becomes an integral extension of the first portion using the process of lateral epitaxial overgrowth (LEO). Thus, in subsequent drawings (FIGS. 9-11) the dashed line is removed. Not only does LEO result in the first and second portions of the semiconductor material 206 becoming an integrated or unitary layer or material, LEO enables the semiconductor material 206 to grow over the buried gate 228, thereby covering and surrounding the gate as shown in the illustrated example of FIG. 8.

Figure 9:
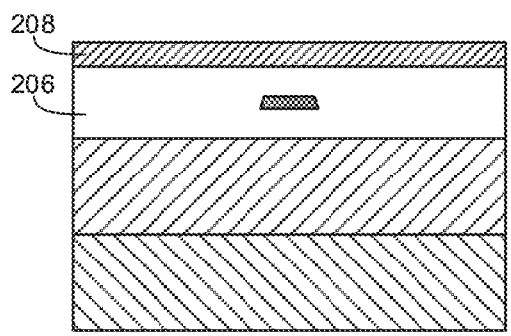
Figure 10:
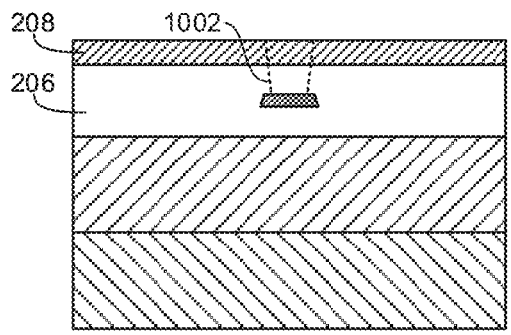

At block 410, the polarization layer 208 is deposited on the semiconductor material 206 (as represented in FIG. 9). At block 412, the polarization layer 208 and the semiconductor material 206 are etched to form a metal via through to the buried gate 228 to enable formation of an electrical connection with the top gate 210. In the illustrated example of FIG. 10, the etched region that extends to the buried gate 8 is represented by dashed lines 1002 to indicate that the etching is not performed in the plane of the cross-sectional view of the illustrated examples. More generally, any portion of the buried gate 228 may be accessed via etching to subsequently provide an electrical connection between the buried gate 228 and the top gate 210. In this manner, the electrical potential of both gates 210, 228 will be the same so that they effectively operate as a single gate with an extended electrical field when energized.

Figure 11:
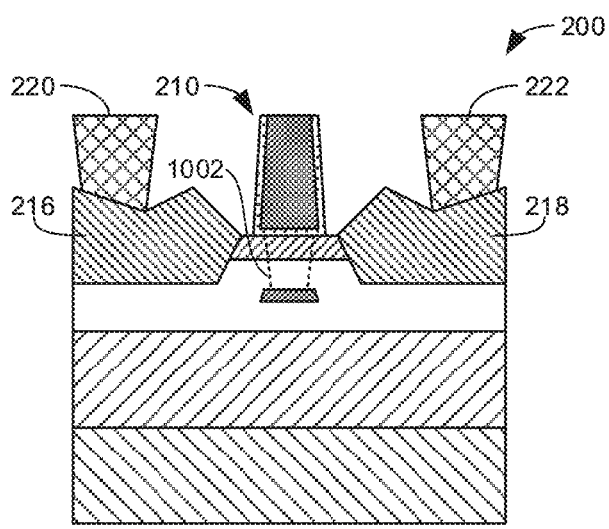

At block 414, the source and drain regions 216, 218 are formed. In some examples, the source and drain regions 216, 218 are formed by etching through the polarization layer 208 down to the semiconductor material 206 and then epitaxially growing the material used for the source and drain regions 216, 218. In some examples, the material used for the source and drain regions 216, 218 corresponds to indium gallium nitride (InGaN). Once the crystalline structure of the source and drain regions 216, 218 have been formed, they may be doped with a dopant (e.g., silicon). At block 416, the top gate 210 is formed electrically connected to the buried gate (e.g., via the etched region 1002). In some examples, the top gate is formed by forming an oxide layer (e.g., a silicate) on the polarization layer 208 and the source and drain regions 216, 218 followed by a patterned mask to etch an opening in the oxide layer for the top gate 210. Thereafter, the gate dielectric 214 is deposited to the surface of the opening to a particular thickness and then the gate conductor 212 fills in the remainder of the opening. In some examples, the gate conductor 212 may be aligned with the metal via deposited on the buried gate 228 described above at block 408 to electrically connect the buried gate 228 and the top gate 210. In other examples, an opening may be etched through the oxide layer down to the metal via associated with the buried gate 228 that is subsequently filled with a conductive material (e.g., metal) that is connected to the gate conductor 212 with metal interconnects formed during subsequent back-end-of-line processes. At block 418, metal contacts 220, 222 are deposited. In some examples, additional openings are etched into the oxide layer mentioned above in connection with block 416 that correspond to the metal contacts 220, 222. Subsequently, the material used for the metal contacts 220, 222 is deposited into the corresponding openings in the oxide layer. The completion of blocks 414, 416, and 418 is represented in FIG. 11, which corresponds to the example transistor 200 of FIG. 2. Thereafter, the example process of FIG. 4 ends.

Although the example method of FIG. 4 is described with reference to the flowchart shown in FIG. 4 and the example stages illustrated in FIGS. 5-11, many other methods of manufacturing the example transistor 200 of FIG. 2 may alternatively be used. For example, the order of execution of the blocks in FIG. 4 may be changed, and/or some of the blocks described may be changed, eliminated, or combined. Similarly, additional operations (e.g., singulation) may be included in the manufacturing process before, in between, or after the blocks shown in FIG. 4.

Figure 12:
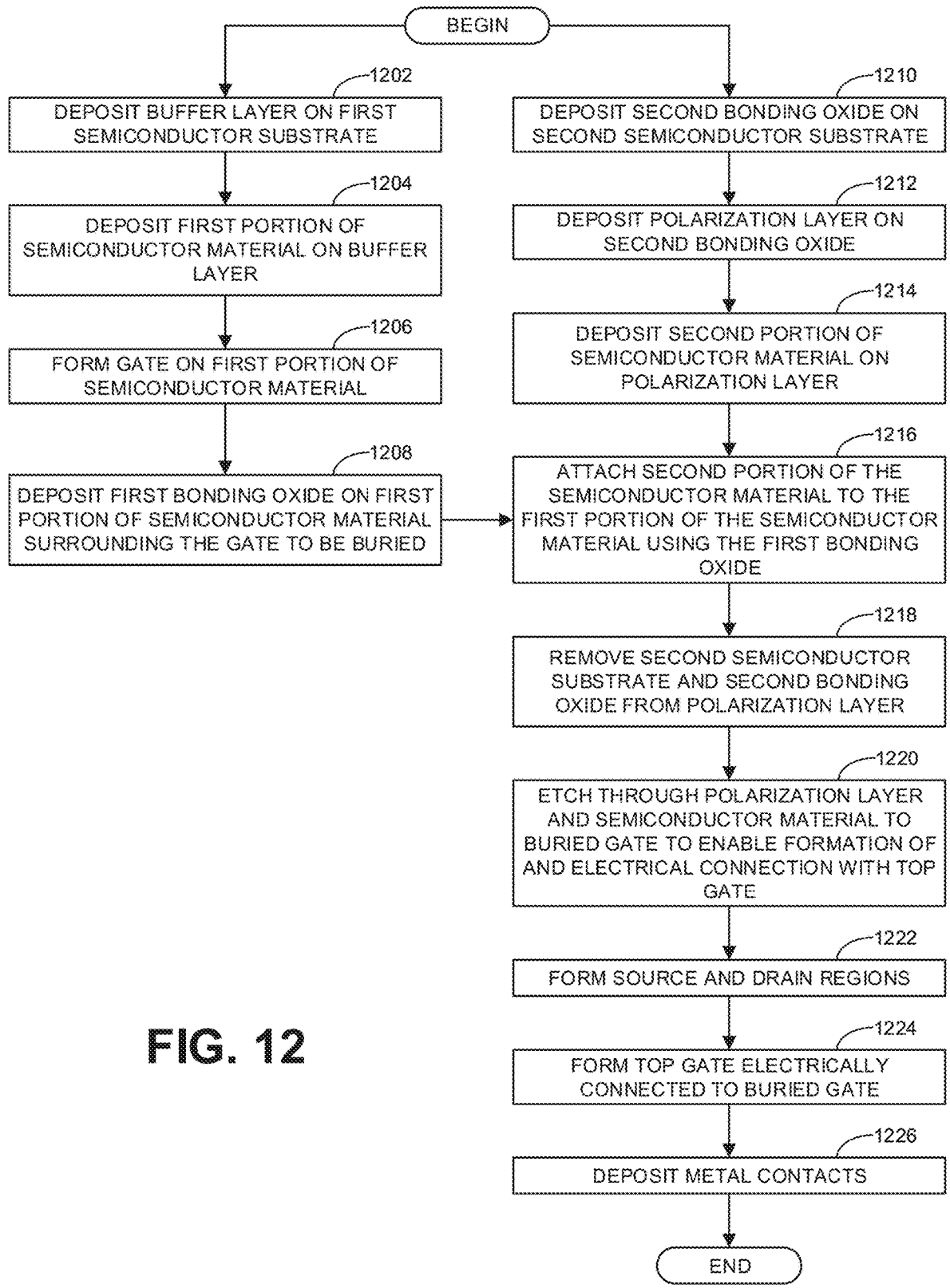
FIG. 12 is a flowchart representative of an example method to manufacture the example transistor of FIG. 3.
Figure 13:
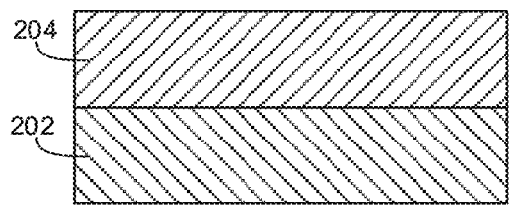
FIGS. 13-22 illustrate stages in the example method of FIG. 12.
Figure 14:
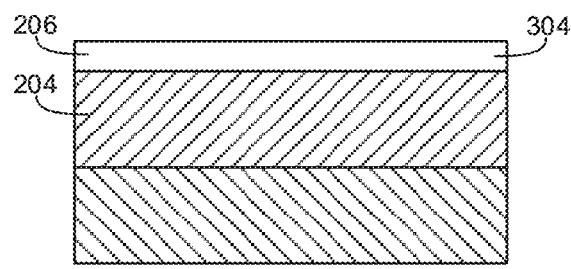
Figure 15:
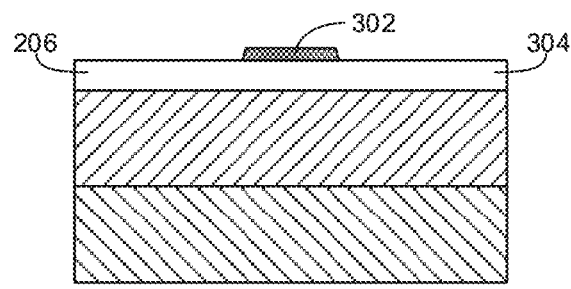
Figure 16:
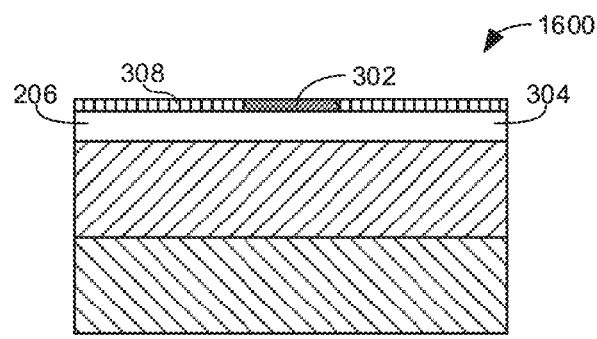

FIG. 12 is a flowchart representative of an example method to manufacture the example transistor 300 of FIG. 3. FIGS. 13-22 illustrate stages in the manufacturing of the transistor 300 of FIG. 3 and will be referenced in the following discussion of FIG. 12. The example process of FIG. 12 begins with two parallel sub-processes that result in upper and lower assemblies for the example transistor 300 that are subsequently stacked and bonded together. The first sub-process corresponds to blocks 1202-1208. At block 1202, the buffer layer 204 is deposited on a first semiconductor substrate (e.g., the base substrate 202) (as represented in FIG. 13). At block 1204, a first portion 304 of the semiconductor material 206 is deposited on the buffer layer 204 (as represented in FIG. 14). At block 1206, the gate 302 to be buried is formed on the first portion 304 of the semiconductor material 206 (as represented in FIG. 15). The formation of the gate 302 may be done in the manner explained above for gate 228. At block 1208, a first bonding oxide (e.g., the bonding oxide 308) is deposited on the first portion 304 of the semiconductor material 206 surrounding the buried gate 302 (as represented in FIG. 16). In the illustrated example of FIG. 16, the first bonding oxide 308 surrounds the buried gate 302 but does not cover the buried gate 302. In other examples, the first bonding oxide 308 may cover both the first portion 304 of the semiconductor material 206 and the buried gate 302. The completion of block 1208 is the end of the first parallel sub-process of the example method of FIG. 12 and results in a lower assembly 1600 of the example transistor 300 of FIG. 3.

Figure 17:
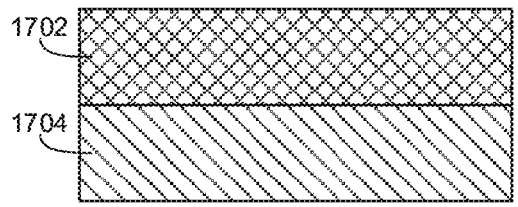
Figure 18:
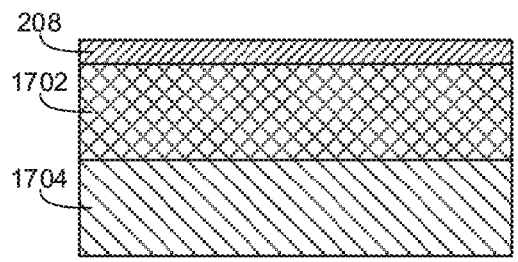
Figure 19:
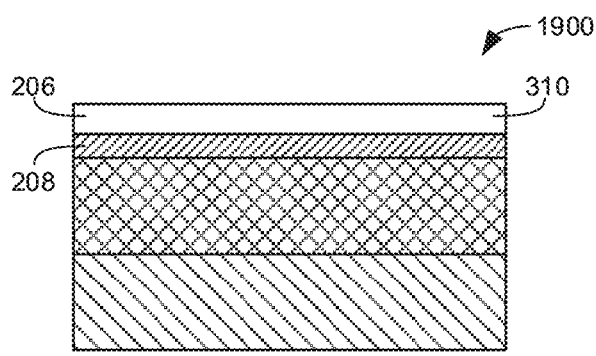
Figure 20:
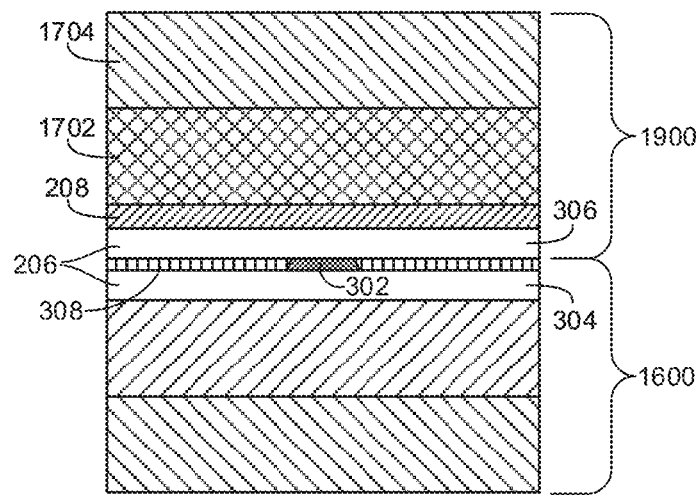

The second parallel sub-process of FIG. 12 corresponds to blocks 1210-1214. At block 1210, a second bonding oxide 1702 is deposited on a second semiconductor substrate 1704 (as represented in FIG. 17). In some examples, the second semiconductor substrate 1704 is made of the same material as the first semiconductor substrate 202 used in the lower assembly 1600 of the transistor 300. For instance, in some examples, the first and second semiconductor substrates 202, 1704 correspond to separate silicon wafers. In other examples, the first and second semiconductor substrates 202, 1704 may be formed of different materials. At block 1212, the polarization layer 208 is deposited on the second bonding oxide 1702 (as represented in FIG. 18). The second bonding oxide 1702 serves to facilitate the adhesion of the polarization layer 208 on the second semiconductor substrate 1704. At block 1214, the second portion 306 of the semiconductor material 206 is deposited on the polarization layer 208 (as represented in FIG. 19). The completion of block 1214 is the end of the second parallel sub-process of the example method of FIG. 12 and results in an upper assembly 1900 of the example transistor 300 of FIG. 3.

The lower assembly 1600 (FIG. 16) resulting from the first sub-process and the upper assembly 1900 (FIG. 19) resulting from the second sub-process are brought together at block 1216 of the example process of FIG. 12. In particular, at block 1216, the second portion 306 of the semiconductor material 206 (associated with the upper assembly 1900) is inverted and attached to the first portion 304 of the semiconductor material 206 (associated with the lower assembly 1600) via the first bonding oxide 308. That is, as shown in the illustrated example of FIG. 20, the upper assembly 1900 is flipped over (relative to the orientation shown in FIG. 19) and positioned on top of the lower assembly 1600 so that the gate 302 is sandwiched (and, thus, buried) between the first and second portions 304, 306 of the semiconductor material 206. The first bonding oxide 308 serves to facilitate the adhesion of the separate portions 304, 306 of the semiconductor material 206. In some examples, the attached assemblies 1600, 1900 undergo an annealing process to strengthen the adhesion between the first bonding oxide 308 and the portions 304, 306 of the semiconductor material 206.

Figure 21:
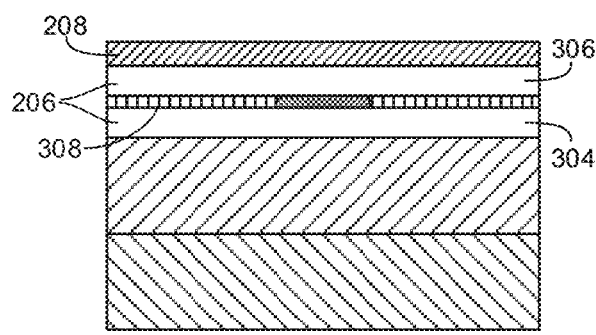
Figure 22:
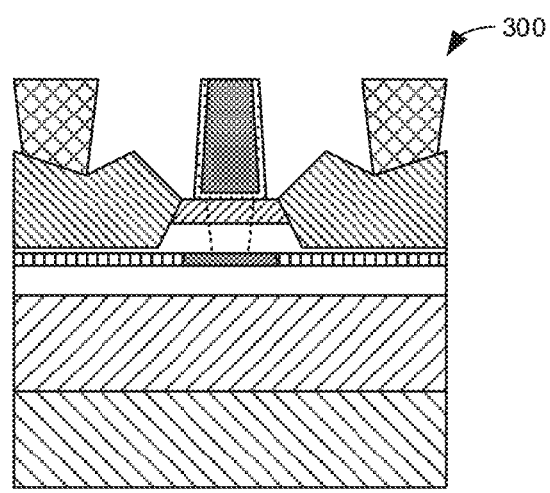

At block 1218, the second semiconductor substrate 1704 and the second bonding oxide 1702 are removed from the polarization layer 208 (as represented in FIG. 21). At this point in the process, the buried gate 302 is buried between separate portions 304, 306 of the semiconductor material 206 with a polarization layer 208 positioned thereon. This is similar to the arrangement shown in FIG. 20 except that in FIG. 21, the separate portions 304, 306 of the semiconductor material 206 are not integrally formed but, instead, are adhered to one another via the bonding oxide 308. Despite this difference blocks 1220, 1222, 1224, and 1226 in the example process of FIG. 12 are respectively identical to blocks 412, 414, 416, and 418 as described above in connection with FIG. 4. Therefore, while the processes of blocks 1220, 1222, 1224, and 1226 are represented in FIG. 12, the explanation of those blocks is not repeated. Instead, the reader is referred to the above description of blocks 412, 414, 416, and 418 for a complete discussion of these blocks. Upon completion of block 1226, the example process of FIG. 12 ends.

Although the example method of FIG. 12 is described with reference to the flowchart shown in FIG. 12 and the example stages illustrated in FIGS. 13-22, many other methods of manufacturing the example transistor 300 of FIG. 3 may alternatively be used. For example, the order of execution of the blocks in FIG. 12 may be changed, and/or some of the blocks described may be changed, eliminated, or combined. As a particular example, the formation of the gate 302 (block 1206) followed by the deposition of the bonding oxide (block 1208) as part of the first parallel sub-process may alternatively be implemented at the end of the second sub-process (e.g., following block 1214) to arrive at a similar end result as described above. Further, additional operations may be included in the manufacturing process before, in between, or after the blocks shown in FIG. 12.

The example buried gate transistors 200, 300 disclosed herein may be included in any suitable electronic component. FIGS. 23-26 illustrate various examples of apparatus that may include any of the example transistors 200, 300 disclosed herein.

Figure 23:
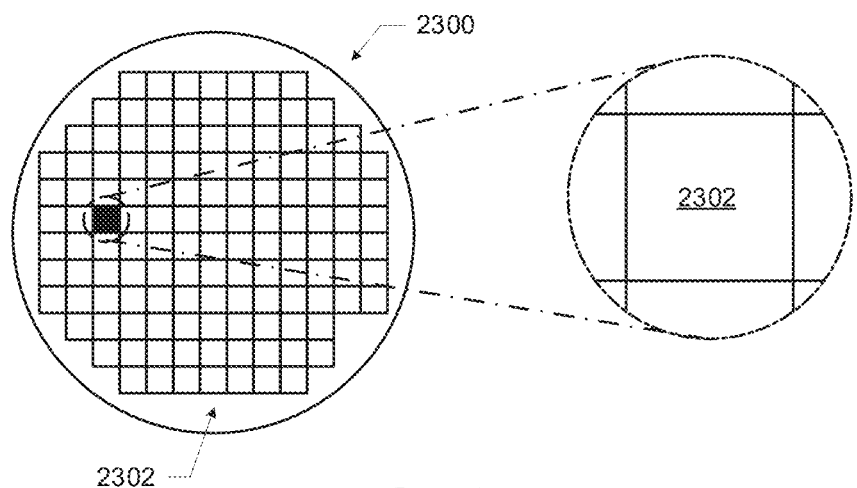
FIG. 23 is a top view of a wafer and dies that may include a buried gate transistor, in accordance with any of the examples disclosed herein.

FIG. 23 is a top view of a wafer 300 and dies 2302 that may include one or more buried gate transistors, or may be included in an IC package whose substrate includes one or more buried gate transistors (e.g., as discussed below with reference to FIG. 25) in accordance with any of the examples disclosed herein. The wafer 2300 may be composed of semiconductor material and may include one or more dies 2302 having IC structures formed on a surface of the wafer 2300. Each of the dies 2302 may be a repeating unit of a semiconductor product that includes any suitable IC. After the fabrication of the semiconductor product is complete, the wafer 2300 may undergo a singulation process in which the dies 2302 are separated from one another to provide discrete "chips" of the semiconductor product. The die 2302 may include one or more buried gate transistors (e.g., as discussed below with reference to FIG. 24), one or more transistors (e.g., some of the transistors 2440 of FIG. 24, discussed below) and/or supporting circuitry to route electrical signals to the transistors, as well as any other IC components. In some examples, the wafer 2300 or the die 2302 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 2302. For example, a memory array formed by multiple memory devices may be formed on a same die 2302 as a processing device (e.g., the processing device 2702 of FIG. 27) or other logic that is configured to store information in the memory devices or execute instructions stored in the memory array.

Figure 24:
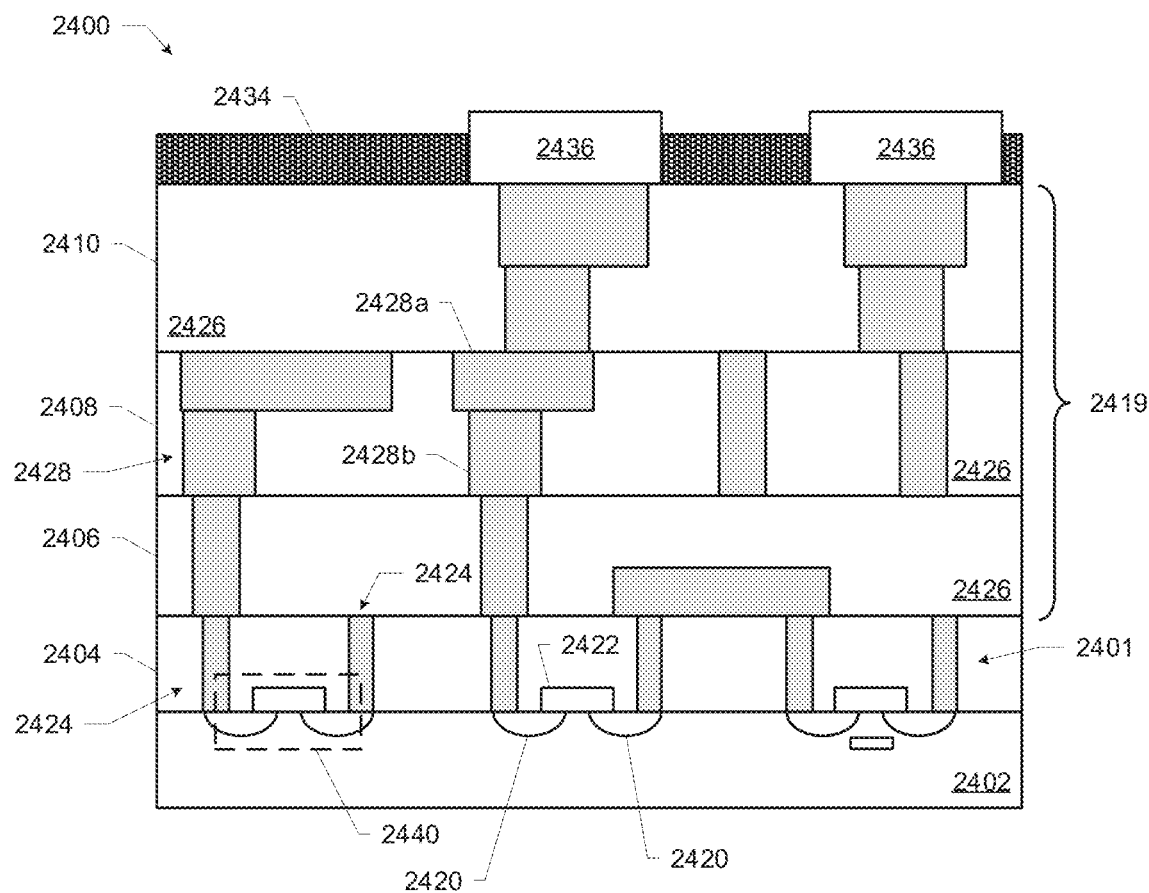
FIG. 24 is a cross-sectional side view of an IC device that may include a buried gate transistor, in accordance with any of the examples disclosed herein.

FIG. 24 is a cross-sectional side view of an IC device 2400 that may include one or more buried gate transistors 2401, or may be included in an IC package whose substrate includes one or more buried gate transistors (e.g., as discussed below with reference to FIG. 25), in accordance with the examples disclosed herein. One or more of the IC devices 2400 may be included in one or more dies 2302 (FIG. 23). The IC device 2400 may be formed on a substrate 2402 (e.g., the wafer 2300 of FIG. 23) and may be included in a die (e.g., the die 2302 of FIG. 23). The substrate 2402 may be a semiconductor substrate composed of semiconductor material systems including, for example, n-type or p-type materials systems (or a combination of both). The substrate 2402 may include, for example, a crystalline substrate formed using a bulk silicon or a silicon-on-insulator (SOI) substructure. In some examples, the substrate 2402 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 2402. Although a few examples of materials from which the substrate 2402 may be formed are described here, any material that may serve as a foundation for an IC device 2400 may be used. The substrate 2402 may be part of a singulated die (e.g., the dies 2302 of FIG. 23) or a wafer (e.g., the wafer 2300 of FIG. 23).

The IC device 2400 may include one or more device layers 2404 disposed on the substrate 2402. The device layer 2404 may include features of one or more transistors 2440 (e.g., metal oxide semiconductor field-effect transistors (MOSFETs)) formed on the substrate 2402. The device layer 2404 may include, for example, one or more source and/or drain (S/D) regions 2420, a gate 2422 to control current flow in the transistors 2440 between the S/D regions 2420, and one or more S/D contacts 2424 to route electrical signals to/from the S/D regions 2420. The transistors 2440 may include additional features not depicted for the sake of clarity, such as device isolation regions, gate contacts, and the like. The transistors 2440 are not limited to the type and configuration depicted in FIG. 24 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 2440 may include a gate 2422 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some examples, an annealing process may be carried out on the gate dielectric to improve its quality when a high-k material is used.

The gate electrode may be formed on the gate dielectric and may include at least one p-type work function metal or n-type work function metal, depending on whether the transistor 2440 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide), and any of the metals discussed above with reference to a PMOS transistor (e.g., for work function tuning).

In some examples, when viewed as a cross-section of the transistor 2440 along the source-channel-drain direction, the gate electrode may consist of a U-shaped structure that includes a bottom portion substantially parallel to the surface of the substrate and two sidewall portions that are substantially perpendicular to the top surface of the substrate. In other examples, at least one of the metal layers that form the gate electrode may simply be a planar layer that is substantially parallel to the top surface of the substrate and does not include sidewall portions substantially perpendicular to the top surface of the substrate. In other examples, the gate electrode may consist of a combination of U-shaped structures and planar, non-U-shaped structures. For example, the gate electrode may consist of one or more U-shaped metal layers formed atop one or more planar, non-U-shaped layers.

In some examples, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some examples, a plurality of spacer pairs may be used; for instance, two pairs, three pairs, or four pairs of sidewall spacers may be formed on opposing sides of the gate stack.

The S/D regions 2420 may be formed within the substrate 2402 adjacent to the gate 2422 of each transistor 2440. The S/D regions 2420 may be formed using an implantation/diffusion process or an etching/deposition process, for example. In the former process, dopants such as boron, aluminum, antimony, phosphorous, or arsenic may be ion-implanted into the substrate 2402 to form the S/D regions 2420. An annealing process that activates the dopants and causes them to diffuse farther into the substrate 2402 may follow the ion-implantation process. In the latter process, the substrate 2402 may first be etched to form recesses at the locations of the S/D regions 2420. An epitaxial deposition process may then be carried out to fill the recesses with material that is used to fabricate the S/D regions 2420. In some implementations, the S/D regions 2420 may be fabricated using a silicon alloy such as silicon germanium or silicon carbide. In some examples, the epitaxially deposited silicon alloy may be doped in situ with dopants such as boron, arsenic, or phosphorous. In some examples, the S/D regions 2420 may be formed using one or more alternate semiconductor materials such as germanium or a group III-V material or alloy. In further examples, one or more layers of metal and/or metal alloys may be used to form the S/D regions 2420.

In some examples, the device layer 2404 may include one or more buried gate transistors, in addition to or instead of transistors 2440. FIG. 24 illustrates a single buried gate transistor 2401 in the device layer 2404 for illustration purposes, but any number and structure of buried gate transistors may be included in a device layer 2404. A buried gate transistor included in a device layer 2404 may be referred to as a "front end" device. In some examples, the IC device 2400 may not include any front end buried gate transistors. One or more buried gate transistors in the device layer 2404 may be coupled to any suitable other ones of the devices in the device layer 2404, to any devices in the metallization stack 2419 (discussed below), and/or to one or more of the conductive contacts 2436 (discussed below).

Electrical signals, such as power and/or input/output (I/O) signals, may be routed to and/or from the devices (e.g., transistors 2440 and/or buried gate transistor 2401) of the device layer 2404 through one or more interconnect layers disposed on the device layer 2404 (illustrated in FIG. 24 as interconnect layers 2406-2310). For example, electrically conductive features of the device layer 2404 (e.g., the gate 2422 and the S/D contacts 2424) may be electrically coupled with the interconnect structures 2428 of the interconnect layers 2406-2310. The one or more interconnect layers 2406-2310 may form a metallization stack (also referred to as an "ILD stack") 2419 of the IC device 2400. In some examples, one or more buried gate transistors may be disposed in one or more of the interconnect layers 2406-2310, in accordance with any of the techniques disclosed herein. A buried gate transistor included in the metallization stack 2419 may be referred to as a "back-end" device. In some examples, the IC device 2400 may not include any back-end buried gate transistors; in some examples, the IC device 2400 may include both front- and back-end buried gate transistors. One or more buried gate transistors in the metallization stack 2419 may be coupled to any suitable ones of the devices in the device layer 2404, and/or to one or more of the conductive contacts 2436 (discussed below).

The interconnect structures 2428 may be arranged within the interconnect layers 2406-2310 to route electrical signals according to a wide variety of designs (in particular, the arrangement is not limited to the particular configuration of interconnect structures 2428 depicted in FIG. 24). Although a particular number of interconnect layers 2406-2310 is depicted in FIG. 24, examples of the present disclosure include IC devices having more or fewer interconnect layers than depicted.

In some examples, the interconnect structures 2428 may include lines 2428a and/or vias 2428b filled with an electrically conductive material such as a metal. The lines 2428a may be arranged to route electrical signals in a direction of a plane that is substantially parallel with a surface of the substrate 2402 upon which the device layer 2404 is formed. For example, the lines 2428a may route electrical signals in a direction in and out of the page from the perspective of FIG. 24. The vias 2428b may be arranged to route electrical signals in a direction of a plane that is substantially perpendicular to the surface of the substrate 2402 upon which the device layer 2404 is formed. In some examples, the vias 2428b may electrically couple lines 2428a of different interconnect layers 2406-2310 together.

The interconnect layers 2406-2310 may include a dielectric material 2426 disposed between the interconnect structures 2428, as shown in FIG. 24. In some examples, the dielectric material 2426 disposed between the interconnect structures 2428 in different ones of the interconnect layers 2406-2310 may have different compositions; in other examples, the composition of the dielectric material 2426 between different interconnect layers 2406-2310 may be the same.

A first interconnect layer 2406 (referred to as Metal 1 or "M1") may be formed directly on the device layer 2404. In some examples, the first interconnect layer 2406 may include lines 2428a and/or vias 2428b, as shown. The lines 2428a of the first interconnect layer 2406 may be coupled with contacts (e.g., the S/D contacts 2424) of the device layer 2404.

A second interconnect layer 2408 (referred to as Metal 2 or "M2") may be formed directly on the first interconnect layer 2406. In some examples, the second interconnect layer 2408 may include vias 2428b to couple the lines 2428a of the second interconnect layer 2408 with the lines 2428a of the first interconnect layer 2406. Although the lines 2428a and the vias 2428b are structurally delineated with a line within each interconnect layer (e.g., within the second interconnect layer 2408) for the sake of clarity, the lines 2428a and the vias 2428b may be structurally and/or materially contiguous (e.g., simultaneously filled during a dual-damascene process) in some examples.

A third interconnect layer 2410 (referred to as Metal 3 or "M3") (and additional interconnect layers, as desired) may be formed in succession on the second interconnect layer 2408 according to similar techniques and configurations described in connection with the second interconnect layer 2408 or the first interconnect layer 2406. In some examples, the interconnect layers that are "higher up" in the metallization stack 2419 in the IC device 2400 (i.e., further away from the device layer 2404) may be thicker.

The IC device 2400 may include a solder resist material 2434 (e.g., polyimide or similar material) and one or more conductive contacts 2436 formed on the interconnect layers 2406-2310. In FIG. 24, the conductive contacts 2436 are illustrated as taking the form of bond pads. The conductive contacts 2436 may be electrically coupled with the interconnect structures 2428 and configured to route the electrical signals of the transistor(s) 2440 to other external devices. For example, solder bonds may be formed on the one or more conductive contacts 2436 to mechanically and/or electrically couple a chip including the IC device 2400 with another component (e.g., a circuit board). The IC device 2400 may include additional or alternate structures to route the electrical signals from the interconnect layers 2406-2310; for example, the conductive contacts 2436 may include other analogous features (e.g., posts) that route the electrical signals to external components.

Figure 25:
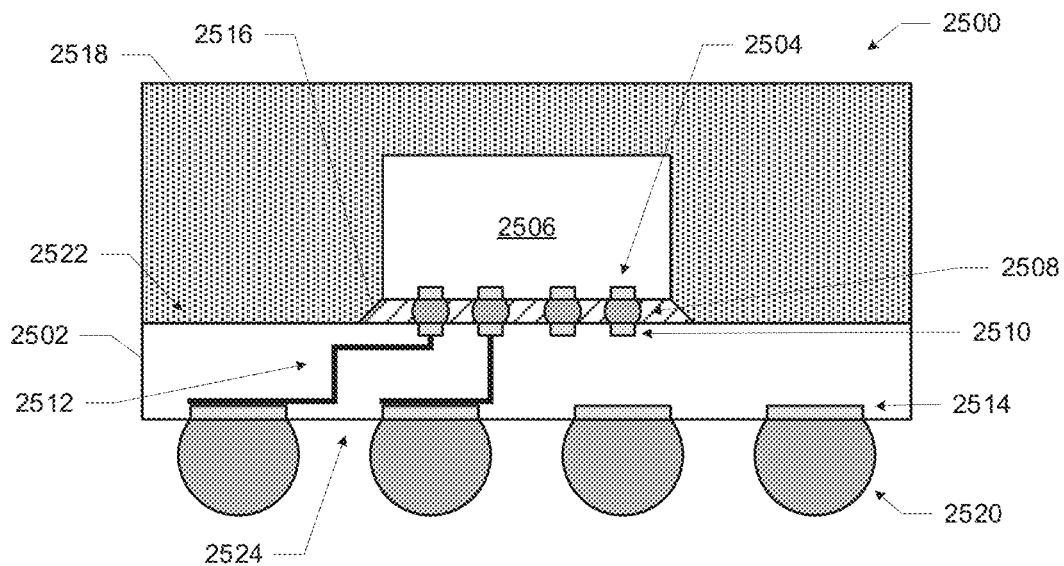
FIG. 25 is a cross-sectional side view of an IC package that may include a buried gate transistor, in accordance with various examples.

FIG. 25 is a cross-sectional view of an example IC package 2500 that may include one or more buried gate transistors. The package substrate 2502 may be formed of a dielectric material, and may have conductive pathways extending through the dielectric material between upper and lower faces 2522, 2524, or between different locations on the upper face 2522, and/or between different locations on the lower face 2524. These conductive pathways may take the form of any of the interconnects 2428 discussed above with reference to FIG. 24. In some examples, any number of buried gate transistors (with any suitable structure) may be included in a package substrate 2502. In some examples, no buried gate transistors may be included in the package substrate 2502.

The IC package 2500 may include a die 2506 coupled to the package substrate 2502 via conductive contacts 2504 of the die 2506, first-level interconnects 2508, and conductive contacts 2510 of the package substrate 2502. The conductive contacts 2510 may be coupled to conductive pathways 2512 through the package substrate 2502, allowing circuitry within the die 2506 to electrically couple to various ones of the conductive contacts 2514 or to the buried gate transistors (or to other devices included in the package substrate 2502, not shown). The first-level interconnects 2508 illustrated in FIG. 25 are solder bumps, but any suitable first-level interconnects 2508 may be used. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket).

In some examples, an underfill material 2516 may be disposed between the die 2506 and the package substrate 2502 around the first-level interconnects 2508, and a mold compound 2518 may be disposed around the die 2506 and in contact with the package substrate 2502. In some examples, the underfill material 2516 may be the same as the mold compound 2518. Example materials that may be used for the underfill material 2516 and the mold compound 2518 are epoxy mold materials, as suitable. Second-level interconnects 2520 may be coupled to the conductive contacts 2514. The second-level interconnects 2520 illustrated in FIG. 25 are solder halls (e.g., for a ball grid array arrangement), but any suitable second-level interconnects 2520 may be used (e.g., pins in a pin grid array arrangement or lands in a land grid array arrangement). The second-level interconnects 2520 may be used to couple the IC package 2500 to another component, such as a circuit board (e.g., a motherboard), an interposer, or another IC package, as known in the art and as discussed below with reference to FIG. 26.

In FIG. 25, the IC package 2500 is a flip chip package, and includes a buried gate transistor in the package substrate 2502. The number and location of buried gate transistors in the package substrate 2502 of the IC package 2500 is simply illustrative, and any number of buried gate transistors (with any suitable structure) may be included in a package substrate 2502. In some examples, no buried gate transistors may be included in the package substrate 2502. The die 2506 may take the form of any of the examples of the die 2302 discussed herein (e.g., may include any of the examples of the IC device 2400). In some examples, the die 2506 may include one or more buried gate transistors (e.g., as discussed above with reference to FIG. 23 and FIG. 24); in other examples, the die 2506 may not include any buried gate transistors.

Although the IC package 2500 illustrated in FIG. 25 is a flip chip package, other package architectures may be used. For example, the IC package 2500 may be a ball grid array (BGA) package, such as an embedded wafer-level ball grid array (eWLB) package. In another example, the IC package 2500 may be a wafer-level chip scale package (WLCSP) or a panel fanout (FO) package. Although a single die 2506 is illustrated in the IC package 2500 of FIG. 25, an IC package 2500 may include multiple dies 2506 (e.g., with one or more of the multiple dies 2506 coupled to buried gate transistors included in the package substrate 2502). An IC package 2500 may include additional passive components, such as surface-mount resistors, capacitors, and inductors disposed on the first face 2522 or the second face 2524 of the package substrate 2502. More generally, an IC package 2500 may include any other active or passive components known in the art.

Figure 26:
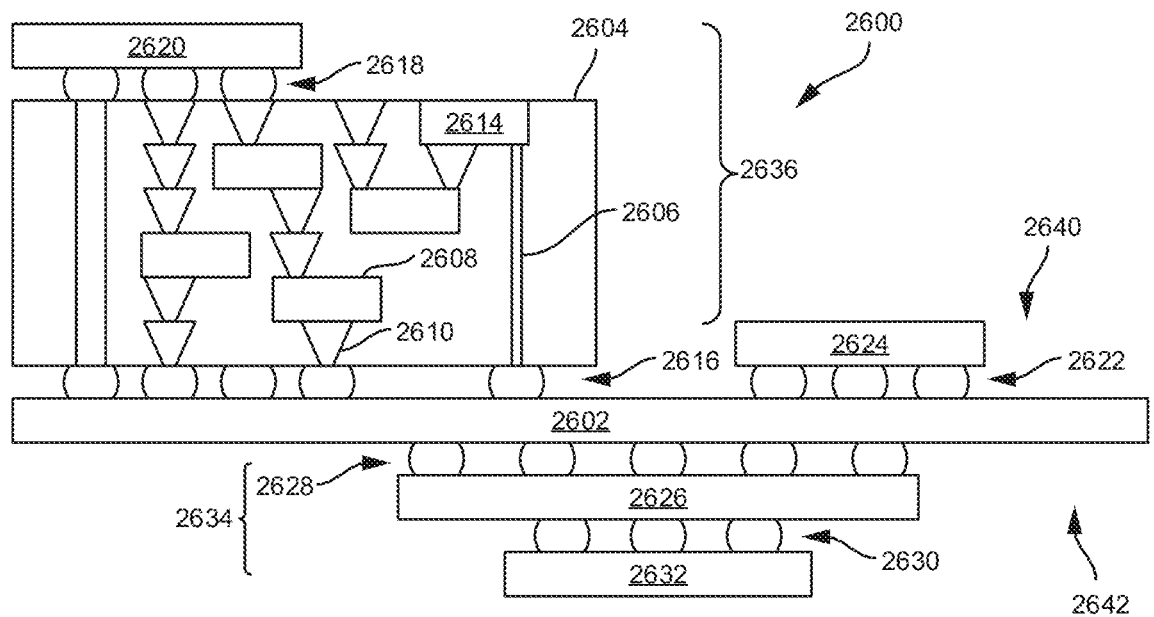
FIG. 26 is a cross-sectional side view of an IC device assembly that may include a buried gate transistor, in accordance with any of the examples disclosed herein.

FIG. 26 is a cross-sectional side view of an IC device assembly 2600 that may include one or more IC packages or other electronic components (e.g., a die) including one or more buried gate transistors, in accordance with any of the examples disclosed herein. The IC device assembly 2600 includes a number of components disposed on a circuit board 2602 (which may be, for example, a motherboard). The IC device assembly 2600 includes components disposed on a first face 2640 of the circuit board 2602 and an opposing second face 2642 of the circuit board 2602; generally, components may be disposed on one or both faces 2640 and 2642. Any of the IC packages discussed below with reference to the IC device assembly 2600 may take the form of any of the examples of the IC package 2500 discussed above with reference to FIG. 25 (e.g., may include one or more buried gate transistors in a package substrate 2502 or in a die).

In some examples, the circuit board 2602 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2602. In other examples, the circuit board 2602 may be a non-PCB substrate.

The IC device assembly 2600 illustrated in FIG. 26 includes a package-on-interposer structure 2636 coupled to the first face 2640 of the circuit board 2602 by coupling components 2616. The coupling components 2616 may electrically and mechanically couple the package-on-interposer structure 2636 to the circuit board 2602, and may include solder balls (as shown in FIG. 26), male and female portions of a socket, an adhesive, an underfill material, and/or any other suitable electrical and/or mechanical coupling structure.

The package-on-interposer structure 2636 may include an IC package 2620 coupled to an interposer 2604 by coupling components 2618. The coupling components 2618 may take any suitable form for the application, such as the forms discussed above with reference to the coupling components 2616. Although a single IC package 2620 is shown in FIG. 26, multiple IC packages may be coupled to the interposer 2604; indeed, additional interposers may be coupled to the interposer 2604. The interposer 2604 may provide an intervening substrate used to bridge the circuit board 2602 and the IC package 2620. The IC package 2620 may be or include, for example, a die (the die 2302 of FIG. 23), an IC device (e.g., the IC device 2400 of FIG. 24), or any other suitable component. Generally, the interposer 2604 may spread a connection to a wider pitch or reroute a connection to a different connection. For example, the interposer 2604 may couple the IC package 2620 (e.g., a die) to a set of BGA conductive contacts of the coupling components 2616 for coupling to the circuit board 2602. In the example illustrated in FIG. 26, the IC package 2620 and the circuit board 2602 are attached to opposing sides of the interposer 2604; in other examples, the IC package 2620 and the circuit board 2602 may be attached to a same side of the interposer 2604. In some examples, three or more components may be interconnected by way of the interposer 2604.

The interposer 2604 may be formed of an epoxy resin, a fiberglass-reinforced epoxy resin, an epoxy resin with inorganic fillers, a ceramic material, or a polymer material such as polyimide. In some examples, the interposer 2604 may be formed of alternate rigid or flexible materials that may include the same materials described above for use in a semiconductor substrate, such as silicon, germanium, and other group III-V and group IV materials. The interposer 2604 may include metal interconnects 2608 and vias 2610, including but not limited to through-silicon vias (TSVs) 2606. The interposer 2604 may further include embedded devices 2614, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 2604. The package-on-interposer structure 2636 may take the form of any of the package-on-interposer structures known in the art. In some examples, the interposer 2604 may include one or more buried gate transistors.

The IC device assembly 2600 may include an IC package 2624 coupled to the first face 2640 of the circuit board 2602 by coupling components 2622. The coupling components 2622 may take the form of any of the examples discussed above with reference to the coupling components 2616, and the IC package 2624 may take the form of any of the examples discussed above with reference to the IC package 2620.

The IC device assembly 2600 illustrated in FIG. 26 includes a package-on-package structure 2634 coupled to the second face 2642 of the circuit board 2602 by coupling components 2628. The package-on-package structure 2634 may include a first IC package 2626 and a second IC package 2632 coupled together by coupling components 2630 such that the first IC package 2626 is disposed between the circuit board 2602 and the second IC package 2632. The coupling components 2628, 2630 may take the form of any of the examples of the coupling components 2616 discussed above, and the IC packages 2626, 2632 may take the form f any of the examples of the IC package 2620 discussed above. The package-on-package structure 2634 may be configured in accordance with any of the package-on-package structures known in the art.

Figure 27:
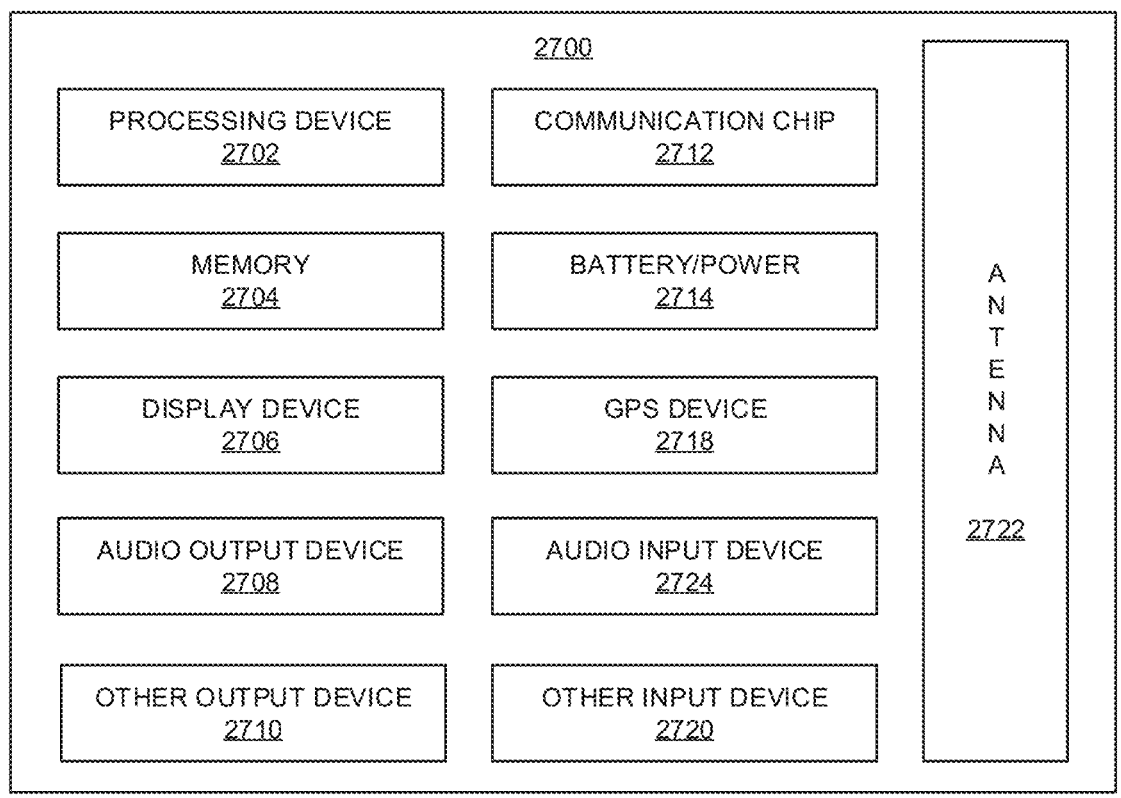
FIG. 27 is a block diagram of an example electrical device that may include a buried gate transistor, in accordance with any of the examples disclosed herein.

FIG. 27 is a block diagram of an example electrical device 2700 that may include one or more buried gate transistors, in accordance with any of the examples disclosed herein. For example, any suitable ones of the components of the electrical device 2700 may include one or more of the IC packages 2500, IC devices 2400, or dies 2302 disclosed herein. A number of components are illustrated in FIG. 27 as included in the electrical device 2700, but any one or more of these components may be omitted or duplicated, as suitable for the application. In some examples, some or all of the components included in the electrical device 2700 may be attached to one or more motherboards. In some examples, some or all of these components are fabricated onto a single system-on-a-chip (SoC) die.

Additionally, in various examples, the electrical device 2700 may not include one or more of the components illustrated in FIG. 27, but the electrical device 2700 may include interface circuitry for coupling to the one or more components. For example, the electrical device 2700 may not include a display device 2706, but may include display device interface circuitry (e.g., a connector and driver circuitry) to which a display device 2706 may be coupled. In another set of examples, the electrical device 2700 may not include an audio input device 2724 or an audio output device 2708, but may include audio input or output device interface circuitry (e.g., connectors and supporting circuitry) to which an audio input device 2724 or audio output device 2708 may be coupled.

The electrical device 2700 may include a processing device 2702 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2702 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 2700 may include a memory 2704, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 2704 may include memory that shares a die with the processing device 2702. This memory may be used as cache memory and may include embedded dynamic random access memory (eDRAM) or spin transfer torque magnetic random access memory (STT-MRAM).

In some examples, the electrical device 2700 may include a communication chip 2712 (e.g., one or more communication chips). For example, the communication chip 2712 may be configured for managing wireless communications for the transfer of data to and from the electrical device 2700. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 2712 may implement any of a number of wireless standards or protocols, including but not limited to Institute for Electrical and Electronic Engineers (IEEE) standards including (IEEE 802.11 family). IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2712 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2712 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2712 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2712 may operate in accordance with other wireless protocols in other examples. The electrical device 2700 may include an antenna 2722 to facilitate wireless communications and/or to receive other wireless communications (such as AM or FM radio transmissions).

In some examples, the communication chip 2712 may manage wired communications, such as electrical, optical, or any other suitable communication protocols (e.g., the Ethernet). As noted above, the communication chip 2712 may include multiple communication chips. For instance, a first communication chip 2712 may be dedicated to shorter-range wireless communications such as Wi-Fi or Bluetooth, and a second communication chip 2712 may be dedicated to longer-range wireless communications such as global positioning system (GPS), EDGE, GPRS, CDMA, WiMAX, LIE, EV-DO, or others. In some examples, a first communication chip 2712 may be dedicated to wireless communications, and a second communication chip 2712 may be dedicated to wired communications.

The electrical device 2700 may include battery/power circuitry 2714. The battery/power circuitry 2714 may include one or more energy storage devices (e.g., batteries or capacitors) and/or circuitry for coupling components of the electrical device 2700 to an energy source separate from the electrical device 2700 (e.g., AC line power).

The electrical device 2700 may include a display device 2706 (or corresponding interface circuitry, as discussed above). The display device 2706 may include any visual indicators, such as a heads-up display, a computer monitor, a projector, a touchscreen display, a liquid crystal display (LCD), a light-emitting diode display, or a flat panel display.

The electrical device 2700 may include an audio output device 2708 (or corresponding interface circuitry, as discussed above). The audio output device 2708 may include any device that generates an audible indicator, such as speakers, headsets, or earbuds.

The electrical device 2700 may include an audio input device 2724 (or corresponding interface circuitry, as discussed above). The audio input device 2724 may include any device that generates a signal representative of a sound, such as microphones, microphone arrays, or digital instruments (e.g., instruments having a musical instrument digital interface (MIDI) output).

The electrical device 2700 may include a GPS device 2718 (or corresponding interface circuitry, as discussed above). The GPS device 2718 may be in communication with a satellite-based system and may receive a location of the electrical device 2700, as known in the art.

The electrical device 2700 may include an other output device 2710 (or corresponding interface circuitry, as discussed above). Examples of the other output device 2710 may include an audio codec, a video codec, a printer, a wired or wireless transmitter for providing information to other devices, or an additional storage device.

The electrical device 2700 may include an other input device 2720 (or corresponding interface circuitry, as discussed above). Examples of the other input device 2720 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (MID) reader.

The electrical device 2700 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 2700 may be any other electronic device that processes data.

From the foregoing, it will be appreciated that example transistors and example methods of manufacturing transistors have been disclosed that include a buried gate maintained at the same electrical potential as a top gate to prevent punch through without reducing a thickness of a semiconductor layer in which a channel is to be formed. The buried gate extends the effective control reach of the electrical field produced by the gates deeper into the semiconductor layer of the transistor, thereby reducing the likelihood of punch through current arising between the source and drain regions of the transistor. More particularly, in some examples, a buried gate is positioned to extend the effective control reach of an electrical field produced by the top gate into a layer of material with a higher bandgap than the semiconductor material of the transistor. The higher bandgap layer serves as an insulator that effectively blocks the formation of an electrical path for punch through current. Reducing the likelihood of punch through current in this matter enables the use of transistors at higher voltages and/or enables the fabrication of smaller transistors giving rise to transistors with improved performance.

The following paragraphs provide various examples of the examples disclosed herein.

Example 1 is a field-effect transistor that includes a source, a drain, and a semiconductor material positioned between the source and the drain. The transistor also includes a first gate positioned adjacent the semiconductor material, and a second gate positioned adjacent the semiconductor material. A portion of the semiconductor material positioned between the first and second gates.

Example 2 includes the transistor as defined in Example 1, wherein the portion of the semiconductor material is a first portion. The first gate is positioned between the first portion of the semiconductor material and a second portion of the semiconductor material.

Example 3 includes the transistor as defined in Example 2, wherein the first and second portions of the semiconductor material are parts of an integrated layer of the semiconductor material.

Example 4 includes the transistor as defined in Example 3, wherein the integrated layer of the semiconductor material surrounds the first gate.

Example 5 includes the system as defined in Example 2, and further includes a bonding oxide adjacent to the first gate, the first portion of the semiconductor material coupled to the second portion of the semiconductor material via the bonding oxide.

Example 6 includes the transistor as defined in Example 5, wherein the bonding oxide is to separate the first portion of the semiconductor material from the first gate.

Example 7 includes the transistor as defined in any one of Examples 2-5, wherein the semiconductor material is a first semiconductor material. The transistor further includes a second semiconductor material. The second portion of the first semiconductor material is positioned between the first gate and the second semiconductor material.

Example 8 includes the transistor as defined in Example 7, wherein the second semiconductor material has a wider bandgap than the first semiconductor material.

Example 9 includes the transistor as defined in any one of Examples 7 or 8, wherein the first semiconductor material includes gallium and nitrogen, the second semiconductor material including aluminum, gallium, and nitrogen.

Example 10 includes the transistor as defined in any one of Examples 7-9, wherein a distance between the first gate and the second semiconductor material is less than or equal to an effective control reach of an electrical field produced by the first gate when powered.

Example 11 includes the transistor as defined in any one of Examples 1-10, wherein at least a portion of the first gate and at least a portion of the second gate are in vertical alignment.

Example 12 includes the transistor as defined in any one of Examples 1-11, wherein the first gate includes at least one of polysilicon or a refractory metal.

Example 13 includes the transistor as defined in any one of Examples 1-12, wherein a distance between the first gate and the second gate is less than a combined distance of a first effective control reach associated with the first gate and a second effective control reach associated with the second gate. The first and second effective control reaches corresponding to electrical fields to be produced by the first and second gates when the first and second gates are powered.

Example 14 includes the transistor as defined in any one of Examples 1-13, wherein a length of the first gate in a direction of electron flow along a channel between the source and the drain is greater than or equal to a length of the second gate and less than or equal to a distance between the source and the drain.

Example 15 includes the transistor as defined in any one of Examples 1-14, wherein the first gate is electrically connected to the second gate to maintain the first and second gates at a same electric potential.

Example 16 is a field-effect transistor that includes a source, a drain, and a semiconductor layer. The transistor further includes a buried gate positioned beneath a top surface of the semiconductor layer, and a top gate positioned above the top surface of the semiconductor layer. The buried gate and the top gate are to activate a channel between the source and the drain.

Example 17 includes the transistor as defined in Example 16, wherein the buried gate is embedded within the semiconductor layer. The semiconductor layer surrounds the buried gate.

Example 18 includes the transistor as defined in Example 16, wherein the buried gate is between a first portion of the semiconductor layer and a second portion of the semiconductor layer.

Example 19 includes the transistor as defined in Example 18, and further includes a bonding oxide to attach the first and second portions of the semiconductor layer.

Example 20 includes the transistor as defined any one of Examples 18 or 19, wherein the first portion of the semiconductor layer is positioned closer to the top gate than the buried gate. The second portion of the semiconductor layer positioned farther away from the top gate than the buried gate.

Example 21 includes the transistor as defined in any one of Examples 16-20, wherein the buried gate includes a different material than the top gate.

Example 22 includes the transistor as defined in any one of Examples 16-21, and further includes a semiconductor material different than the semiconductor layer. The buried gate is positioned between the semiconductor material and the top gate.

Example 23 includes the transistor as defined in Example 22, wherein the semiconductor material exhibits a wider bandgap than the semiconductor layer.

Example 24 includes the transistor as defined in any one of Examples 22 or 23, wherein the semiconductor layer includes gallium and nitrogen. The semiconductor material includes aluminum, gallium, and nitrogen.

Example 25 includes the transistor as defined in any one of Examples 22-24, wherein an effective control reach of an electrical field to be produced by the buried gate when powered is to extend into the semiconductor material.

Example 26 includes the transistor as defined in any one of Examples 16-25, wherein the top gate is to produce a first electrical field when powered and the buried gate is to produce a second electrical field when powered, the buried gate is spaced apart from the top gate by less than a combined effective control reach of the first and second electrical fields.

Example 27 includes the transistor as defined in any one of Examples 16-26, wherein a length of the buried gate in a direction of electron flow within the channel is greater than or equal to a length of the top gate and less than or equal to a distance between the source and the drain.

Example 28 includes the transistor as defined in any one of Examples 16-27, and further includes an electrical connector to maintain the top gate and the buried gate at a same electrical potential.

Example 29 is a transistor that includes a semiconductor substrate, a source, a drain, and a gate having an effective control reach to activate a channel in the semiconductor substrate between the source and the drain. The transistor further includes means for extending the effective control reach of the gate.

Example 30 includes the transistor as defined in Example 29, wherein the gate and the means for extending are in circuit.

Example 31 includes the transistor as defined in Example 30, wherein the gate and the means for extending are maintained at a same electrical potential.

Example 32 includes the transistor as defined in any one of Examples 29-31, wherein the means for extending is buried beneath at least a portion of the semiconductor substrate.

Example 33 includes the transistor as defined in any one of Examples 29-32, wherein the extending means is to extend the effective control reach of the gate to reduce a likelihood of punch through.

Example 34 is a system that includes a processing device including: a communications chip, and a transistor. The transistor includes a semiconductor material, a first gate positioned above a top surface of the semiconductor material, and a second gate positioned below a top surface of the semiconductor material.

Example 35 includes the system as defined in Example 34, wherein the second gate is embedded within the semiconductor material. The semiconductor material surrounds the second gate.

Example 36 includes the system as defined in Example 34, wherein the second gate is between a first portion of the semiconductor material and a second portion of the semiconductor material.

Example 37 includes the system as defined in Example 36, and further includes a bonding oxide to attach the first and second portions of the semiconductor material.

Example 38 includes the system as defined in any one of Examples 36 or 37, wherein the first portion of the semiconductor material is positioned closer to the first gate than the second gate. The second portion of the semiconductor material is positioned farther away from the first gate than the second gate.

Example 39 includes the system as defined in any one of Examples 34-38, wherein the second gate includes a different material than the first gate.

Example 40 includes the system as defined in any one of Examples 34-38, and further includes a semiconductor buffer layer positioned below the second gate.

Example 41 includes the system as defined in Example 40, wherein the semiconductor buffer layer exhibits a wider bandgap than the semiconductor material.

Example 42 includes the system as defined in any one of Examples 40 or 41, wherein the semiconductor material includes gallium and nitrogen. The semiconductor buffer layer includes aluminum, gallium, and nitrogen.

Example 43 includes the system as defined in any one of Examples 40-42, wherein an effective control reach of an electrical field to be produced by the second gate when powered is to extend into the semiconductor buffer layer.

Example 44 includes the system as defined in any one of Examples 34-43, wherein the first gate is to produce a first electrical field when powered and the second gate is to produce a second electrical field when powered. The second gate is spaced apart from the first gate by less than a combined effective control reach of the first and second electrical fields.

Example 45 includes the system as defined in any one of Examples 34-44, wherein a length of the second gate in a direction of electron flow between a source and a drain of the transistor is greater than or equal to a length of the first gate and less than or equal to a distance between the source and the drain.

Example 46 includes the system as defined in any one of Examples 34-45, and further includes an electrical connector to maintain the first gate and the second gate at a same electrical potential.

Example 47 is a method of manufacturing a field-effect transistor. The method includes forming a first gate, forming a semiconductor material to bury the first gate, and forming a second gate. A portion of the semiconductor material is positioned between the first gate and the second gate.

Example 48 includes the method as defined in Example 47, and further includes forming the semiconductor material by: forming a first portion of the semiconductor material, forming the first gate on the first portion of the semiconductor material, and forming a second portion of the semiconductor material over the first gate using lateral epitaxial overgrowth of the first portion of the semiconductor material.

Example 49 includes the method as defined in Example 48, and further includes forming the semiconductor material by: forming a first portion of the semiconductor material in connection with a first semiconductor wafer, forming a second portion of the semiconductor material in connection with a second semiconductor wafer, and attaching the first portion of the semiconductor material to the second portion of the semiconductor material via a bonding oxide. The first and second portions of the semiconductor material are to sandwich the first gate therebetween.

Example 50 includes the method as defined in Example 49, and further includes forming the bonding oxide on the first portion of the semiconductor material adjacent the first gate. The first gate is formed on the first portion of the semiconductor material.

Example 51 includes the method as defined in any one of Examples 48-50, wherein the portion of the semiconductor material is a first portion. The method further includes: forming a buffer layer on a semiconductor substrate, and forming a second portion of the semiconductor material on the buffer layer.

Example 52 includes the method as defined in any one of Examples 48-51, and further includes electrically connecting the first gate to the second gate to enable the First gate to be maintained at a same electric potential as the second gate when powered.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A field-effect transistor, comprising:
    a first semiconductor material at least partially between a source and a drain;
    a first gate adjacent the first semiconductor material;
    a second gate adjacent the first semiconductor material, wherein a first portion of the first semiconductor material is between the first and second gates, and wherein the first gate is between the first portion of the first semiconductor material and a second portion of the first semiconductor material; and
    a second semiconductor material, wherein the second portion of the first semiconductor material is between the first gate and the second semiconductor material.

2. The field-effect transistor of claim 1, wherein the first and second portions of the semiconductor material are parts of an integrated layer of the semiconductor material.

3. The field-effect transistor of claim 1, further comprising a bonding layer comprising oxygen, the first portion of the semiconductor material coupled to the second portion of the semiconductor material via the bonding layer.

4. The field-effect transistor of claim 1, wherein the second semiconductor material has a wider bandgap than the first semiconductor material.

5. The field-effect transistor of claim 1, wherein a distance between the first gate and the second semiconductor material is less than or equal to an effective control reach of an electrical field to be produced by the first gate.

6. The field-effect transistor of claim 1, wherein at least a portion of the first gate and at least a portion of the second gate are in vertical alignment.

7. The field-effect transistor of claim 1, wherein a distance between the first gate and the second gate is less than a combined distance of a first effective control reach associated with the first gate and a second effective control reach associated with the second gate.

8. The field-effect transistor of claim 1, wherein the first gate is electrically connected to the second gate.

9. A system comprising:
    a communications chip; and
    a transistor comprising:
        a first semiconductor material at least partially between a source and a drain;
        a first gate adjacent the first semiconductor material;
        a second gate adjacent the first semiconductor material wherein a first portion of the first semiconductor material is between the first and second gates, and wherein the first gate is between the first portion of the first semiconductor material and a second portion of the first semiconductor material; and
        a second semiconductor material, wherein the second portion of the first semiconductor material is between the first gate and the second semiconductor material.

10. The system of claim 9, wherein the second gate is embedded within the first semiconductor material, the first semiconductor material surrounding the second gate.

11. The system of claim 9, wherein the second semiconductor material has a wider bandgap than the first semiconductor material.

12. The system of claim 9, wherein at least a portion of the first gate and at least a portion of the second gate are in vertical alignment.

13. The system of claim 9, further comprising a bonding layer comprising oxygen, the first portion of the first semiconductor material coupled to the second portion of the first semiconductor material via the bonding layer.

14. The system of claim 9, wherein a distance between the first gate and the second gate is less than a combined distance of a first effective control reach associated with the first gate and a second effective control reach associated with the second gate.

15. A field-effect transistor, comprising:
    a semiconductor material at least partially between a source and a drain;
    a first gate adjacent the semiconductor material; and
    a second gate positioned adjacent the semiconductor material, wherein a portion of the semiconductor material is between the first and second gates, and wherein a distance between the first gate and the second gate is less than a combined distance of a first effective control reach associated with the first gate and a second effective control reach associated with the second gate.

16. The field-effect transistor of claim 15, wherein the portion of the semiconductor material is a first portion, the first gate between the first portion of the semiconductor material and a second portion of the semiconductor material.

17. The field-effect transistor of claim 16, wherein the first and second portions of the semiconductor material are parts of an integrated layer of semiconductor material.

18. The field-effect transistor of claim 16, further comprising a bonding layer comprising oxygen, the first portion of the semiconductor material coupled to the second portion of the semiconductor material via the bonding layer.

19. The field-effect transistor of claim 16, wherein the semiconductor material is a first semiconductor material, the field-effect transistor further comprising a second semiconductor material, the second portion of the first semiconductor material between the first gate and the second semiconductor material.

20. The field-effect transistor of claim 15, wherein at least a portion of the first gate and at least a portion of the second gate are in vertical alignment.

\* \* \* \* \*